(12) United States Patent
Ng

(10) Patent No.: US 9,347,980 B2
(45) Date of Patent: May 24, 2016

(54) RADIO FREQUENCY CHARACTERISTICS MEASUREMENT JIG DEVICE

(71) Applicant: Kabushiki Kaisha Toshiba, Minato-ku (JP)

(72) Inventor: Choon Yong Ng, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 171 days.

(21) Appl. No.: 14/323,041

(22) Filed: Jul. 3, 2014

(65) Prior Publication Data

US 2015/0070044 A1  Mar. 12, 2015

(30) Foreign Application Priority Data

Sep. 9, 2013 (JP) .................................. 2013-186735

(51) Int. Cl.
*G01R 1/067* (2006.01)
*G01R 31/26* (2014.01)
(Continued)

(52) U.S. Cl.
CPC ............ *G01R 31/2601* (2013.01); *G01R 1/045* (2013.01); *H01L 22/14* (2013.01)

(58) Field of Classification Search
CPC .......... H01L 2924/30107; H01L 2924/13064; H01L 2224/27334; H01L 23/66; H01L 23/36; H01L 23/5389; H01L 24/83; H01L 2223/6677; H01L 23/645; H01L 25/0655; H01L 2224/73265; H01L 2224/73267; H01L 2224/8312; H01L 23/49575; H01L 23/49861; H01L 24/95; H01L 2933/005; H01L 33/486; H01P 1/20; H01P 1/16; H01P 1/2088; H01P 1/163; H01P 3/082; H01P 3/123; H01P 5/085; G02F 1/0356; H04B 5/00; H04B 5/0081; H04B 5/0075; G01R 1/04; G01R 1/045; G01R 31/2601
See application file for complete search history.

(56) References Cited

U.S. PATENT DOCUMENTS 5,451,567 A * 9/1995 Das ........................ H01P 1/181
                                                              333/161
6,057,700 A   5/2000 Crispell
(Continued)

FOREIGN PATENT DOCUMENTS

JP   6-303010 A   10/1994
JP   9-223906 A    8/1997
(Continued)

OTHER PUBLICATIONS

Extended Search Report issued Mar. 5, 2015 in European Patent Application No. 14177080.0.
(Continued)

*Primary Examiner* — Vinh Nguyen
(74) *Attorney, Agent, or Firm* — Oblon, McClelland, Maier & Neustadt, L.L.P

(57) ABSTRACT

A radio frequency characteristics measurement jig device includes: a ground conductor part; a first coplanar line; a connection substrate; and a holding part. The first coplanar line includes a first dielectric layer, a first center conductive layer and first ground conductive layers. The connection substrate includes a second dielectric layer, a second center conductive layer, second ground conductive layers, and a third ground conductive layer. The holding part is configured to press the connection substrate to the first coplanar line and the signal terminal so as to allow electrical continuity between the first center conductive layer and the second center conductive layer on the first region, to allow electrical continuity between the first ground conductive layer and the second ground conductive layer, and to allow electrical continuity between the second center conductive layer on the second region and the signal terminal.

16 Claims, 5 Drawing Sheets

(51) Int. Cl.
  *H01L 21/66* (2006.01)
  *G01R 1/04* (2006.01)

(56) References Cited

U.S. PATENT DOCUMENTS

| | | | |
|---|---|---|---|
| 6,070,478 | A | 6/2000 | Krajec et al. |
| 6,298,738 | B1 | 10/2001 | Krajec et al. |
| 6,646,522 | B1 * | 11/2003 | Kozyrev ............ H01P 1/181 333/161 |
| 2005/0258819 | A1 | 11/2005 | Hoshi et al. |
| 2007/0103144 | A1 | 5/2007 | Hoshi et al. |
| 2011/0207242 | A1 | 8/2011 | Loiselet |
| 2011/0227601 | A1 | 9/2011 | Hashimoto et al. |

FOREIGN PATENT DOCUMENTS

| | | |
|---|---|---|
| JP | 11-83936 A | 3/1999 |
| JP | 2003-140099 A | 5/2003 |

OTHER PUBLICATIONS

Office Action mailed Mar. 3, 2016 in Japanese Patent Application No. 2013-186735 (with English Translation).

* cited by examiner

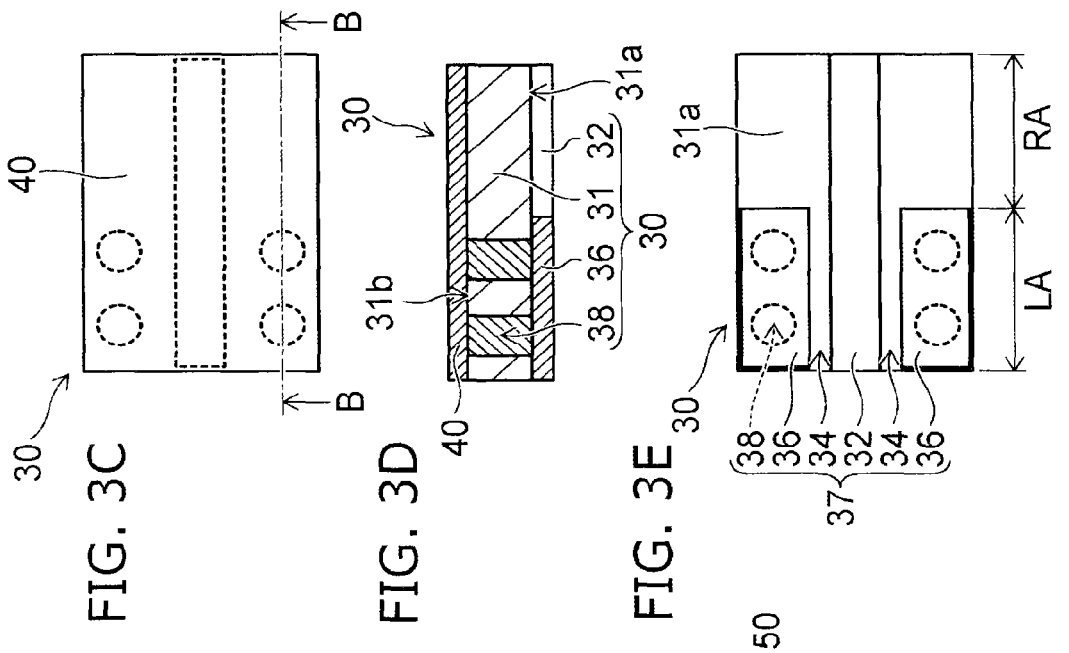
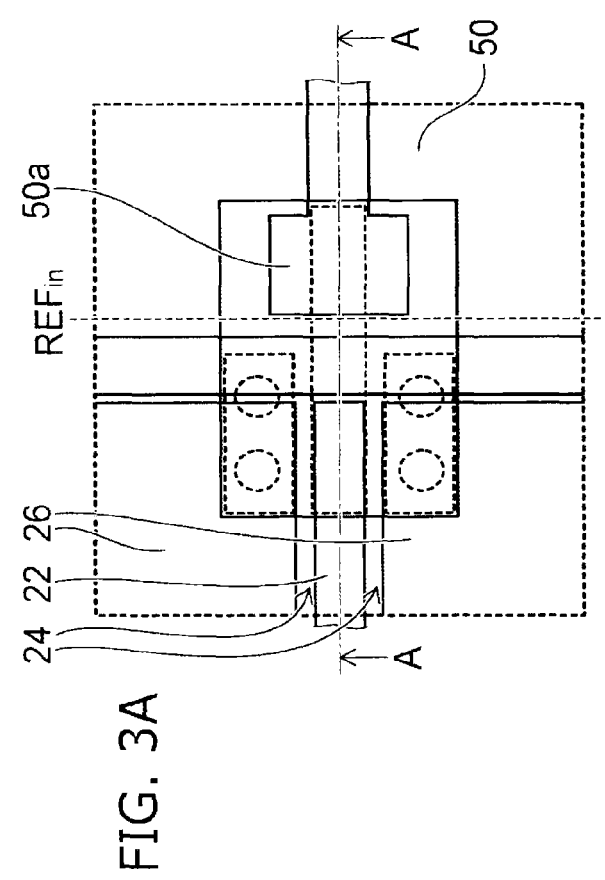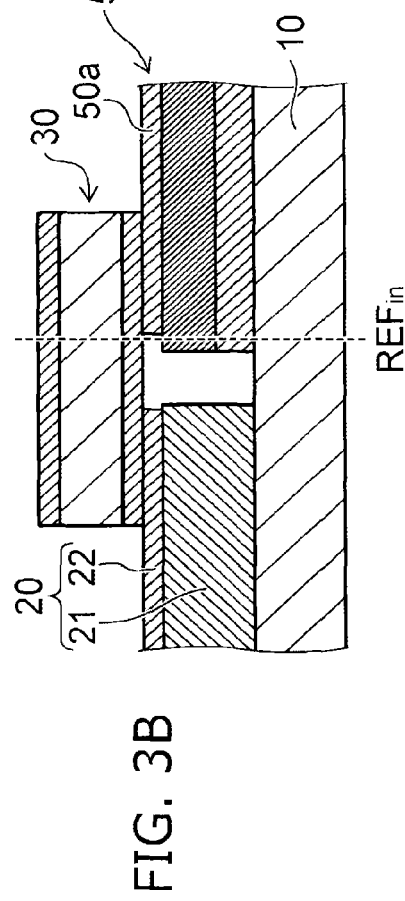

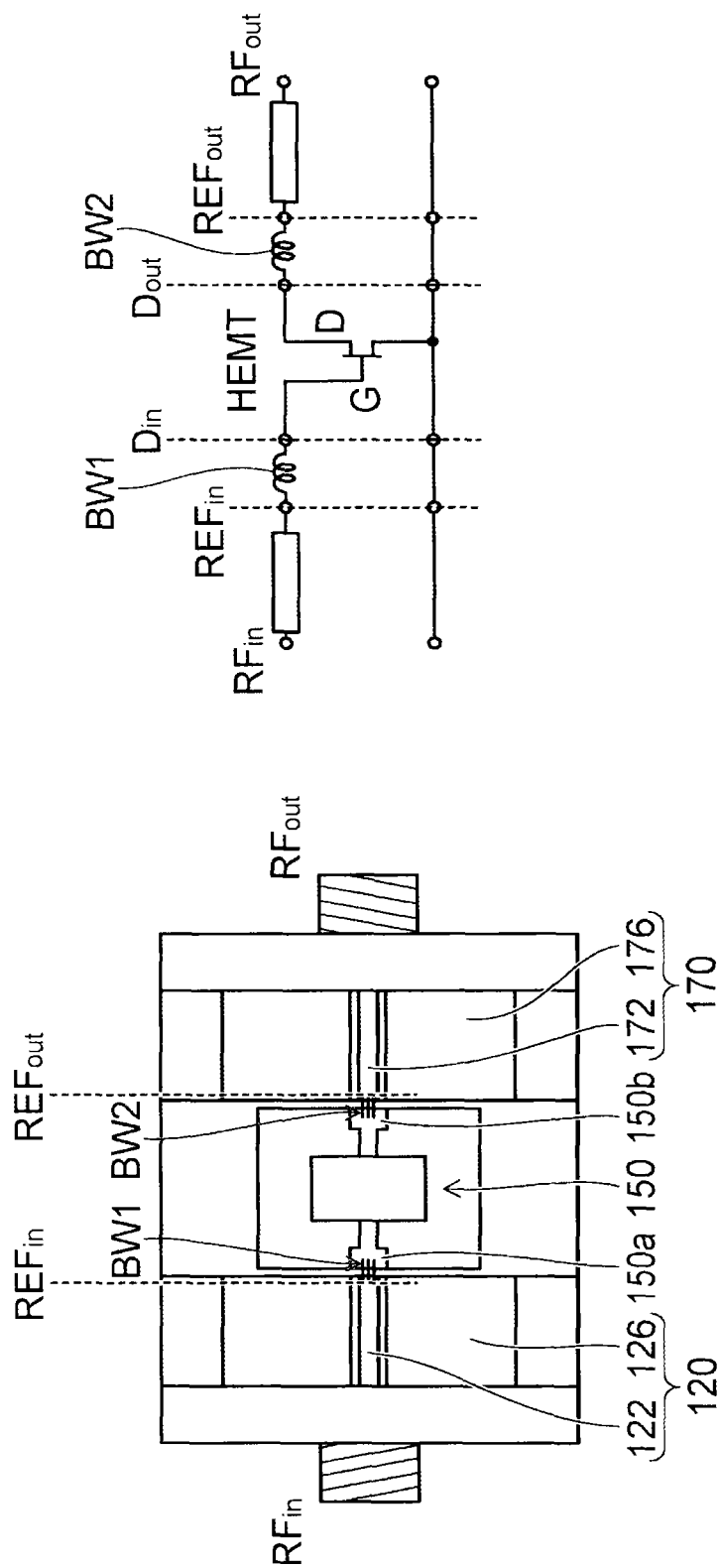

RADIO FREQUENCY CHARACTERISTICS MEASUREMENT JIG DEVICE

CROSS-REFERENCE TO RELATED APPLICATIONS

This application is based upon and claims the benefit of priority from Japanese Patent Application No. 2013-186735, filed on Sep. 9, 2013; the entire contents of which are incorporated herein by reference.

FIELD

Embodiments described herein relate generally a radio frequency characteristics measurement jig device.

BACKGROUND

Radio frequency semiconductor devices such as GaN HEMT (high electron mobility transistor) and SiC MESFET (metal semiconductor field effect transistor) can provide high power at radio frequencies.

Thus, further expansion of their application to satellite communication base stations and radar devices is expected.

Radio frequency semiconductor devices and MMIC (microwave monolithic integrated circuit) are connected to microstrip lines to constitute an electronic device. Thus, radio frequency semiconductor devices and MMIC are preferably mounted in a package with reduced parasitic capacitance and parasitic inductance.

In this situation, the efficiency of the assembly process can be improved by screening radio frequency devices satisfying the required specifications and incorporating them in the electronic device. Thus, there is demand for a measurement device capable of measuring radio frequency characteristics with high accuracy in a short time.

It is easy to measure a packaged device having a lead terminal. However, cost of the packaged device becomes higher because the package structure and its manufacturing process become complicated. On the other hand, cost of the lead-less package becomes lower. However, as the lead-less package needs solder or adhesive for measurement, it would be difficult not to leave the solder or the adhesive on the surface of product.

BRIEF DESCRIPTION OF THE DRAWINGS

FIG. 3A is a schematic plan view describing the measurement state, FIG. 3B is a schematic sectional view taken along line A-A, FIG. 3C is a schematic plan view of the connection substrate. FIG. 3D is a schematic sectional view of the connection substrate, and FIG. 3E is a schematic bottom view of the connection substrate;

FIG. 4A is a schematic plan view of a radio frequency characteristics measurement jig device according to a comparative example, and FIG. 4B is an equivalent circuit diagram thereof.

DETAILED DESCRIPTION

In general, according to one embodiment, a radio frequency characteristics measurement jig device includes: a ground conductor part; a first coplanar line; a connection substrate; and a holding part. The radio frequency characteristics measurement jig device is used to measure a radio frequency device including a signal terminal. The first coplanar line includes a first dielectric layer provided on a surface of the ground conductor part, a first center conductive layer provided on a surface of the first dielectric layer, and first ground conductive layers respectively provided outside first gaps provided on both sides of the first center conductive layer on the surface of the first dielectric layer. The connection substrate includes a second dielectric layer having a first surface and a second surface on an opposite side from of the first surface, a second center conductive layer provided on the first surface, second ground conductive layers respectively provided outside second gaps provided on both sides of the second center conductive layer, and a third ground conductive layer provided on the second surface and connected to the second ground conductive layer. The second dielectric layer includes a first region provided with the second center conductive layer and the second ground conductive layer and constituting a second coplanar line, and a second region not provided with the second ground conductive layer outside the second center conductive layer. The holding part is configured to press the connection substrate to the first coplanar line and the signal terminal so as to allow electrical continuity between the first center conductive layer and the second center conductive layer on the first region, to allow electrical continuity between the first ground conductive layer and the second ground conductive layer, and to allow electrical continuity between the second center conductive layer on the second region and the signal terminal.

Embodiments of the invention will now be described with reference to the drawings.

Figure 1:
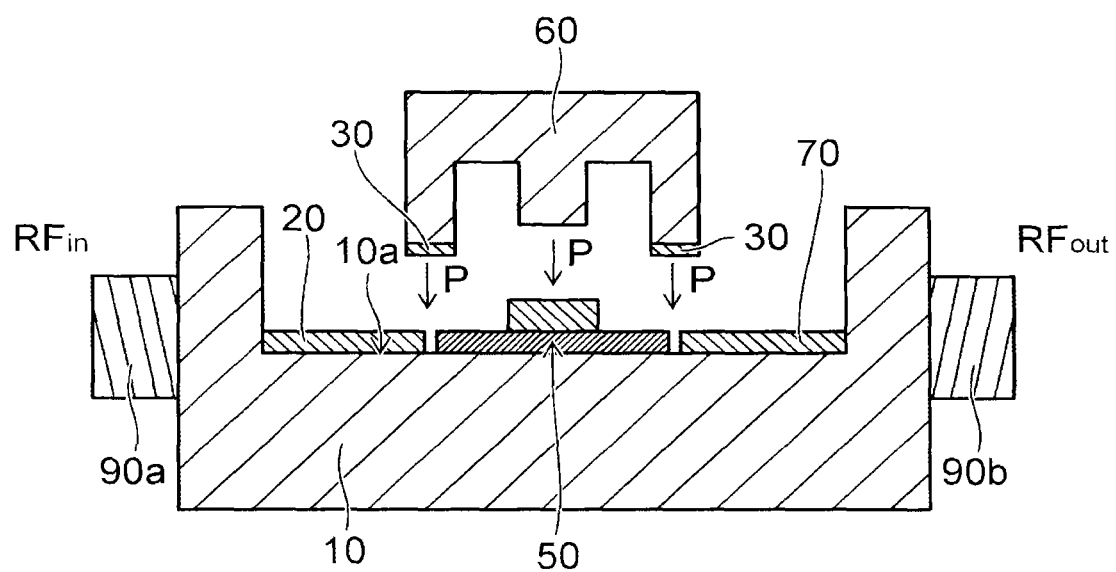
FIG. 1 is a schematic sectional view of a radio frequency characteristics measurement jig device according to a first embodiment.

FIG. 1 is a schematic sectional view of a radio frequency characteristics measurement jig device according to a first embodiment.

The radio frequency characteristics measurement jig device can be used to measure radio frequency devices such as semiconductor devices and passive components.

The radio frequency device includes at least one signal terminal. For instance, in the case where the semiconductor device is a SiC MESFET, GaN HEMT, MMIC or the like, the signal terminals include an input terminal and an output terminal.

The radio frequency characteristics measurement jig device includes a ground conductor part 10, a first coplanar (coplanar waveguide) line 20, a connection substrate 30, and a holding part 60. The first coplanar line 20 is provided on the surface 10a of the ground conductor part 10 and connected to a coaxial connector 90a, 90b or the like. The radio frequency device 50 is mounted on the surface 10a of the ground conductor part 10. Here, the ground conductor part 10 can be provided with a recess, and the radio frequency device 50 can be mounted at the bottom surface thereof. Then, the mounting position can be made accurate.

The connection substrate 30 is attached to the holding part 60 or the like to press the first coplanar line 20 and the signal terminal of the radio frequency device 50 with pressure P. As a result, a radio frequency signal outputted from the signal generator is inputted to the radio frequency device 50. The reflection coefficient (e.g., $S_{11}$ and $S_{22}$ of the S parameters) of the radio frequency device 50 can be measured by measuring the phase and amplitude of the reflected wave.

In the case where a first coplanar line 70 is provided on the output side, for instance, the phase of the output radio frequency signal of the radio frequency device 50 is measured by a phase measurement device, and the amplitude thereof is measured by a power meter. Here, the holding part 60 includes a movable mechanism that can be raised or lowered electrically or manually.

Figures 2A, 2B:
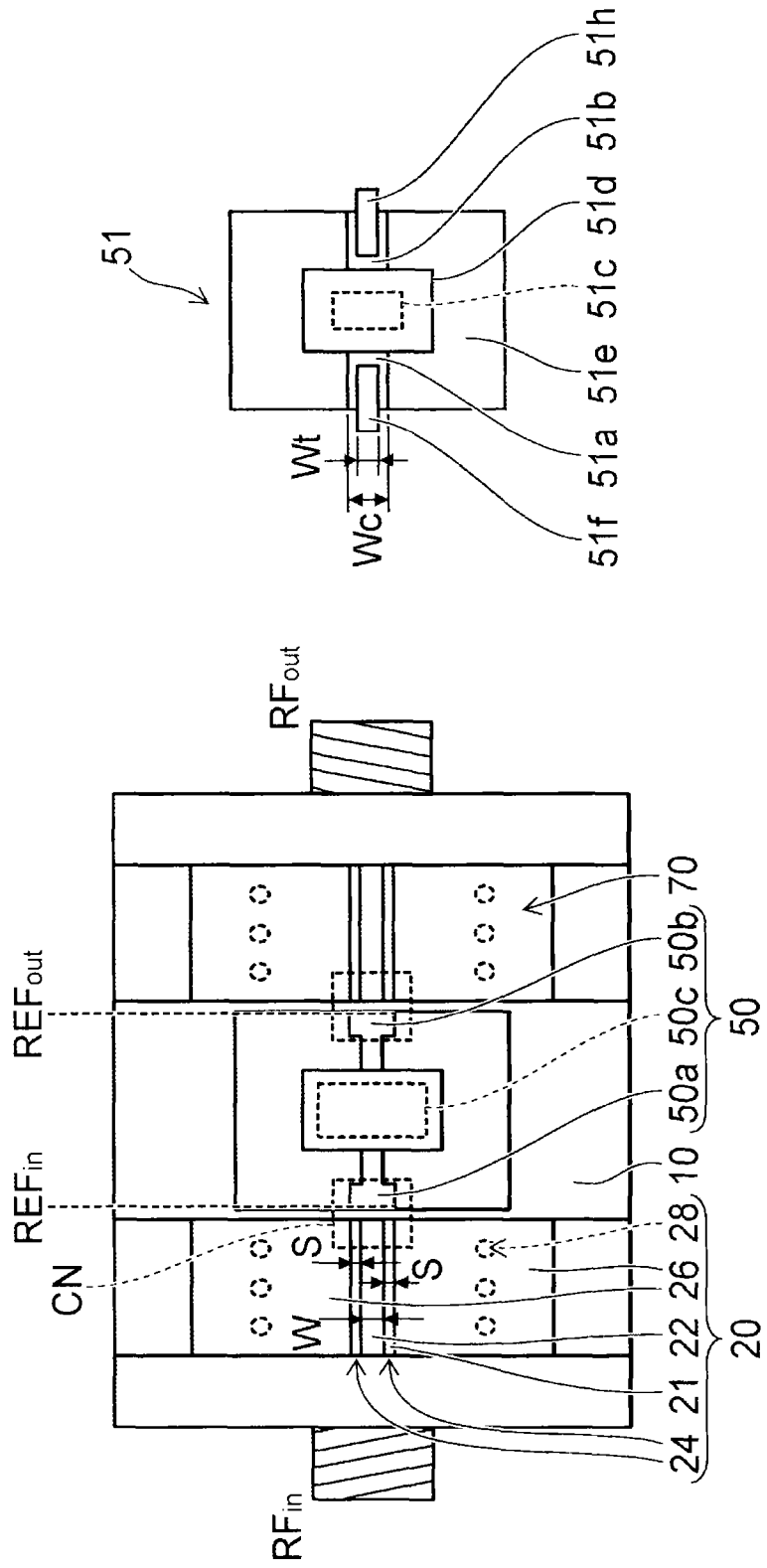
FIG. 2A is a schematic view showing the planar layout of the radio frequency characteristics measurement jig device.
FIG. 2B is a schematic plan view of the semiconductor device including a lead terminal.

FIG. 2A is a schematic view showing the planar layout of the radio frequency characteristics measurement jig device. FIG. 2B is a schematic plan view of the semiconductor element including a lead terminal.

Here, FIG. 2A shows a radio frequency characteristics measurement jig device of the semiconductor device such as SiC MESFET, GaN HEMT, and MMIC mounted in a package.

The first coplanar line 20 includes a first dielectric layer 21 provided on the surface 10*a* of the ground conductor part 10, a first center conductive layer 22 provided on the surface of the first dielectric layer 21, and first ground conductive layers 26 respectively provided outside first gaps (slots) 24 provided on both sides of the first center conductive layer 22 on the surface of the first dielectric layer 21.

The characteristic impedance and phase constant can be controlled by changing e.g. the width W of the first center conductive layer 22, the width S of the first gap 24, and the thickness and relative permittivity of the first dielectric layer 21.

The first ground conductive layer 26 can be connected to the ground conductor part 10 through e.g. a metal layer or the like embedded in a through hole 28 provided in the first dielectric layer 21.

In FIG. 2A, the chip 50*c* of the semiconductor element is mounted in a carrier plate package including no leads. In this case, the rear surface side of the package can be made of a metal plate. This facilitates releasing the heat generated in the chip 50*c* to the ground conductor part 10. The signal terminals 50*a*, 50*b* can be made of e.g. a conductive layer provided on the surface of an insulator layer.

Alternatively, as shown in FIG. 2B, the chip 50*c* of the semiconductor element can be mounted in a package including leads. In this case, for instance, the signal terminals 51*f*, 51*h* can be leads bonded by silver brazing or the like to conductive layers 51*a*, 51*b* provided on the surface of an insulator layer 51*e*. The leads can be made of Kovar or the like.

FIG. 3A is a schematic plan view describing the measurement state. FIG. 3B is a schematic sectional view taken along line A-A. FIG. 3C is a schematic plan view of the connection substrate. FIG. 3D is a schematic sectional view of the connection substrate. FIG. 3E is a schematic bottom view of the connection substrate.

FIG. 3A is a schematic plan view enlarging the region CN of FIG. 2A. The connection substrate 30 includes a second coplanar line 37 and a third ground conductive layer 40.

The second coplanar line 37 includes a second dielectric layer 31 having a first surface 31*a* and a second surface 31*b* on the opposite side from the first surface 31*a*, a second center conductive layer 32 provided on the first surface 31*a* of the second dielectric layer 31, and second ground conductive layers 36 respectively provided outside second gaps 34 provided on both sides of the second center conductive layer 32.

The third ground conductive layer 40 is provided on the second surface 31*b*. The second conductive layer 36 and the third conductive layer 40 are connected through a metal layer or the like embedded in a through hole 38 provided in the second dielectric layer 31. The second dielectric layer 31 includes a first region LA provided with the second conductive layer 32 and the second ground conductive layer 36 and constituting the second coplanar line, and a second region RA not provided with the second ground conductive layer outside the second conductive layer 32.

The holding part 60 presses the connection substrate 30 to the first coplanar line 20 and the signal terminal 50*a* so as to allow electrical continuity between the first center conductive layer 22 and the second center conductive layer 32, to allow electrical continuity between the first ground conductive layer 26 and the second ground conductive layer 36, and to allow electrical continuity between the second center conductive layer 32 of the second region RA of the second dielectric layer 31 and the signal terminal 50*a*.

The first ground conductive layer 26 of the first coplanar line 20 and the second ground conductive layer 36 of the second coplanar line 37 of the connection substrate 30 are electrically connected by pressing. This can reduce discontinuity of the ground surface. Furthermore, the connection substrate 30 acts as a conversion circuit from the first region LA being the second coplanar line 37 to the second region RA being the microstrip line. Thus, the signal terminal 50*a* of the radio frequency device 50 is connected to the microstrip line. Both signal terminals 50*a* and 50*b* have a wide width acting as a capacitance to compensate a parasitic inductance of a bonding wire in practical use.

As a result, in FIGS. 3A and 3B, a reference plane REFin can be accurately defined. For instance, the input impedance of the radio frequency device 50 at the reference plane REFin can be determined. The input matching circuit and the like can be accurately determined based on this input impedance. Furthermore, if a first coplanar line 70 is provided also on the output side as shown in FIG. 2A, a reference plane REFout can be defined.

Assume that both the first coplanar line 20 on the input side and the first coplanar line 70 on the output side have a characteristic impedance of 50 Ω. Then, circuit parameters such as $S_{21}$ and $S_{12}$ of the S parameters can be determined. In this case, the impedance conversion error due to the use of the connection substrate 30 can be reduced. Thus, the circuit parameters can be accurately determined up to the Ka (~30 GHz) band.

FIG. 4A is a schematic plan view of a radio frequency characteristics measurement jig device according to a comparative example. FIG. 4B is an equivalent circuit diagram thereof.

The radio frequency device 150 is connected to coplanar lines 120, 170 and microstrip lines by bonding wires BW1, BW2 and the like, and the radio frequency characteristics are measured. Total inspection of product radio frequency devices by wire bonding is not desirable because of appearance problems and increased inspection cost.

Furthermore, as shown in FIG. 4B, the inductance of the bonding wire occurs between the input side reference plane REFin and the radio frequency device 150, and between the radio frequency device 150 and the output side reference plane REFout. For instance, if the bonding wire has a length of 400 μm, the inductance is generally 0.4 nH. This increases the reactance at 12 GHz to generally j30 Ω.

Accurate determination of the input impedance of the radio frequency device at the input side reference plane Din and the output impedance of the radio frequency device at the output side reference plane Dout requires correction by subtracting the inductance of the bonding wire BW1, BW2 from the impedance measured at the reference plane REFin, REFout. However, at high frequencies like the Ka band, it is difficult to accurately correct the inductance of the bonding wire.

On the other hand, it is also possible to perform radio frequency characteristics measurement by bringing a radio frequency probe into contact with the signal terminal or lead of the package without using bonding wires. However, because the tip part of the probe is narrow, it is difficult to pass a large current therein. Furthermore, the contact resistance is also large. Thus, the measurement voltage is 10 V or less. Semiconductor devices such as GaN HEMT and SiC MES-FET often have an operating voltage of 50 V or more. Thus, in the radio frequency characteristics measurement using a probe, it is difficult to measure radio frequency characteristics such as gain and saturation power in the state close to the operation time.

Figure 5A:
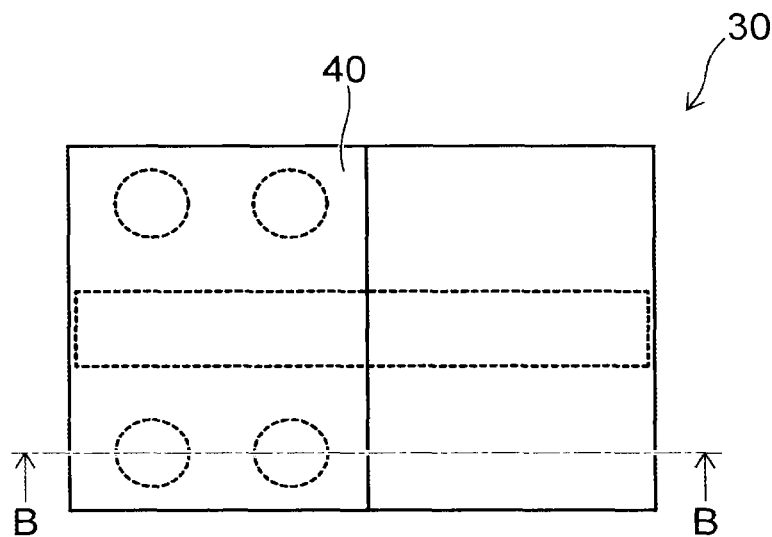
FIG. 5A is a schematic plan view of a variation of the connection substrate.
Figure 5B:
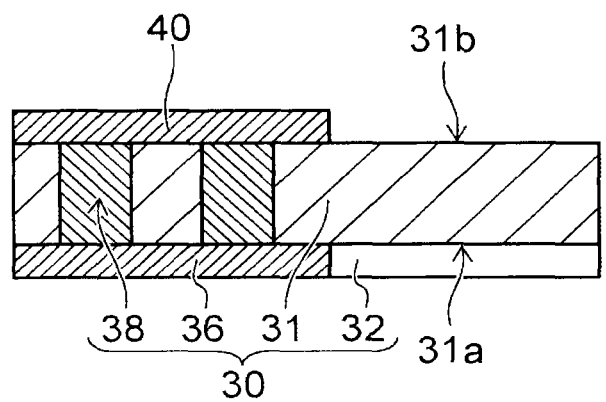
FIG. 5B is a schematic sectional view of the variation taken along line B-B.
Figure 5C:
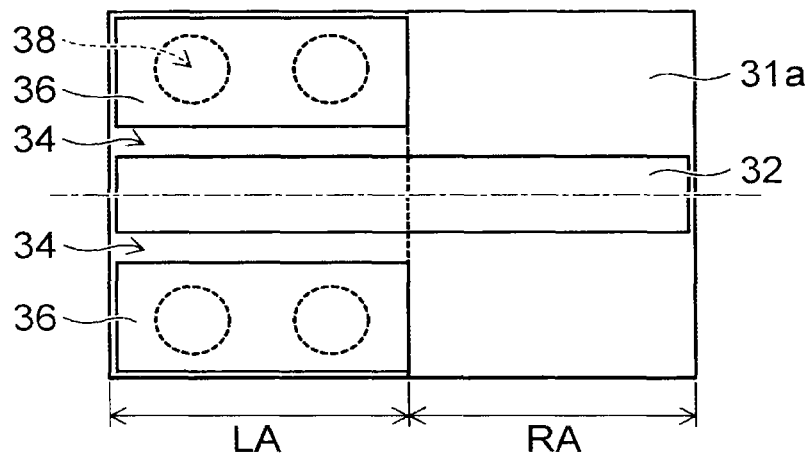
FIG. 5C is a schematic bottom view of the variation.

FIG. 5A is a schematic plan view of a variation of the connection substrate. FIG. 5B is a schematic sectional view of the variation taken along line B-B. FIG. 5C is a schematic bottom view of the variation.

In the case where the radio frequency device 50 is a high power HEMT or high power MESFET, the chip shape is made rectangular, and the width thereof is narrowed. The longitudinal direction of the rectangular chip is made generally orthogonal to the extending direction of the coplanar lines and microstrip lines. That is, the cell regions constituting the radio frequency device 50 are arranged in parallel. This facilitates achieving high power.

In such a multi-cell configuration, the width (denoted by We and Wt in FIG. 2B) of the input/output signal terminal is widened to equalize the distance from the reference plane REFin to each cell region and the distance from each cell region to the reference plane REFout. Then, the device can be operated uniformly in a balanced manner.

Furthermore, in the multi-cell configuration, the active region of the radio frequency device 50 is expanded, and the junction capacitance is increased. Thus, the input/output impedance is lowered. The width of the transmission line constituting the rectification circuit is also easily widened. That is, as the width of the signal terminal 50a of the radio frequency device 50 becomes wider, the signal terminal 50a is connected more easily to the external rectification circuit.

In the second region RA of the second dielectric layer 31 of the connection substrate 30 of the invention, no ground conductive layer is provided on the first surface 31a side. Thus, even if the width of the signal terminal 50a is wide, contact of the signal terminal 50a with the ground conductive layer of the connection substrate 30 can be suppressed.

In the variation of the connection substrate 30 shown in FIGS. 5A to 5C, no ground conductive layer is provided on the second surface 31b of the second region RA of the second dielectric layer 31. The second region RA is a region converted to a microstrip line. Thus, discontinuity of the ground surface can be reduced by not providing the ground conductive layer above the second center conductive layer 32.

The embodiments of the invention provide a radio frequency characteristics measurement jig device capable of measuring radio frequency devices such as semiconductor elements and circuit components at a frequency of 1 GHz to the Ka band. In the connection substrate connecting the radio frequency device with the transmission line, the influence of the discontinuity of the ground surface can be reduced. This facilitates improving the measurement accuracy. The connection substrate provides electrical continuity between the jig and the device mounted in a leadless carrier-plate package.

The coplanar-microstrip conversion allows the package to have a wide signal terminal 50a, 50b for compensating the parasitic inductance of the bonding wire in practical use. Furthermore, no connection by wiring bonding is performed. This can improve the efficiency of the inspection process without compromising the appearance of products.

Furthermore, the invention includes a coplanar-microstrip line conversion substrate used for radio frequency characteristics measurement jig devices and the like. The coplanar-microstrip line conversion substrate includes a dielectric layer having a first surface and a second surface on the opposite side from the first surface, a center conductive layer provided on the first surface, second ground conductive layers respectively provided outside gaps provided on both sides of the center conductive layer, and a third ground conductive layer provided on the second surface and connected to the second ground conductive layer. The dielectric layer includes a first region provided with the center conductive layer and the second ground conductive layer and constituting a second coplanar line, and a second region not provided with the second ground conductive layer outside the center conductive layer.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A radio frequency characteristics measurement jig device used to measure a radio frequency device including a signal terminal, comprising:

a ground conductor part;

a first coplanar line including a first dielectric layer provided on a surface of the ground conductor part, a first center conductive layer provided on a surface of the first dielectric layer, and first ground conductive layers respectively provided outside first gaps provided on both sides of the first center conductive layer on the surface of the first dielectric layer;

a connection substrate including a second dielectric layer having a first surface and a second surface on an opposite side of the first surface, a second center conductive layer provided on the first surface, second ground conductive layers respectively provided outside second gaps provided on both sides of the second center conductive layer, and a third ground conductive layer provided on the second surface and connected to the second ground conductive layer, the second dielectric layer including a first region provided with the second center conductive layer and the second ground conductive layer and constituting a second coplanar line, and a second region not provided with the second ground conductive layer outside the second center conductive layer; and a holding part configured to press the connection substrate to the first coplanar line and the signal terminal so as to allow electrical continuity between the first center conductive layer and the second center conductive layer on the first region, to allow electrical continuity between the first ground conductive layer and the second ground conductive layer, and to allow electrical continuity between the second center conductive layer on the second region and the signal terminal.

2. The device according to claim 1, wherein
the first coplanar line includes an input side line configured to propagate an input radio frequency signal, and an output side line configured to propagate an output radio frequency signal, and
the connection substrate includes a first substrate connecting the input side line with an input signal terminal of the radio frequency devices, and a second substrate connecting the output side line with an output signal terminal of the radio frequency devices.

3. The device according to claim 2, wherein the second surface side of the connection substrate is attached to the holding part.

4. The device according to claim 3, wherein the second ground conductive layer and the third ground conductive layer are connected through a through hole provided in the second dielectric layer.

5. The device according to claim 4, wherein the third ground conductive layer of the connection substrate is provided on the first region of the second dielectric layer.

6. The device according to claim 3, wherein the third ground conductive layer of the connection substrate is provided on the first region of the second dielectric layer.

7. The device according to claim 2, wherein the second ground conductive layer and the third ground conductive layer are connected through a through hole provided in the second dielectric layer.

8. The device according to claim 2, wherein the third ground conductive layer of the connection substrate is provided on the first region of the second dielectric layer.

9. The device according to claim 7, wherein the third ground conductive layer of the connection substrate is provided on the first region of the second dielectric layer.

10. The device according to claim 1, wherein the second surface side of the connection substrate is attached to the holding part.

11. The device according to claim 10, wherein the second ground conductive layer and the third ground conductive layer are connected through a through hole provided in the second dielectric layer.

12. The device according to claim 11, wherein the third ground conductive layer of the connection substrate is provided on the first region of the second dielectric layer.

13. The device according to claim 10, wherein the third ground conductive layer of the connection substrate is provided on the first region of the second dielectric layer.

14. The device according to claim 1, wherein the second ground conductive layer and the third ground conductive layer are connected through a through hole provided in the second dielectric layer.

15. The device according to claim 14, wherein the third ground conductive layer of the connection substrate is provided on the first region of the second dielectric layer.

16. The device according to claim 1, wherein the third ground conductive layer of the connection substrate is provided on the first region of the second dielectric layer.

\* \* \* \* \*